(12) United States Patent
Fushimi

(10) Patent No.: US 10,794,639 B2
(45) Date of Patent: Oct. 6, 2020

(54) COOLING STRUCTURE AND MOUNTING STRUCTURE

(71) Applicant: NEC Corporation, Minato-ku, Tokyo (JP)

(72) Inventor: Makoto Fushimi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/291,074

(22) Filed: Mar. 4, 2019

(65) Prior Publication Data

US 2019/0285362 A1 Sep. 19, 2019

(30) Foreign Application Priority Data

Mar. 13, 2018 (JP) ................. 2018-045080

(51) Int. Cl.
| | | |
|---|---|---|
| *H05K 7/00* | (2006.01) | |
| *H05K 7/02* | (2006.01) | |
| *H01L 23/34* | (2006.01) | |
| *H01L 23/36* | (2006.01) | |
| *H01L 23/433* | (2006.01) | |
| *H01L 23/473* | (2006.01) | |
| *F28F 7/00* | (2006.01) | |
| *F28F 13/00* | (2006.01) | |
| *F28F 3/06* | (2006.01) | |

(Continued)

(52) U.S. Cl.
CPC ............... *F28F 3/06* (2013.01); *F28F 3/022* (2013.01); *H05K 1/0203* (2013.01); *F28F 2215/14* (2013.01); *H05K 1/181* (2013.01); *H05K 2201/066* (2013.01); *H05K 2201/10424* (2013.01); *H05K 2201/10734* (2013.01)

(58) Field of Classification Search
CPC . H05K 7/00; H05K 7/20; H01L 23/34; H01L 23/36; H01L 23/433; H01L 23/473; H01L 23/4338; F28F 7/00; F28F 13/00
USPC ........... 361/710, 720, 679.47, 752; 174/16.3, 174/520; 165/46, 80.2, 80.3, 80.4, 165/104.21, 104.33; 29/727, 890.03, 29/890.045, 890.049
See application file for complete search history.

(56) References Cited

U.S. PATENT DOCUMENTS 4,226,281 A * 10/1980 Chu .................... H01L 23/4338
165/185
4,235,283 A * 11/1980 Gupta ................ H01L 23/4338
165/185

(Continued)

FOREIGN PATENT DOCUMENTS

| JP | H02-78255 A | 3/1990 |
|---|---|---|
| JP | H06-77364 A | 3/1994 |

(Continued)

OTHER PUBLICATIONS

Japanese Office Action for JP Application No. 2018-045080 dated Jan. 29, 2019 with English Translation.

*Primary Examiner* — Xiaoliang Chen

(57) ABSTRACT

A cooling structure includes a plurality of heat radiation parts configured to cool a heat generating component and a holding member configured to hold the plurality of heat radiation parts. Moreover, the heat radiation parts of the cooling structure each include a base portion located on the side of the heat generating component and a fin portion extending from the base portion and radiating heat. Furthermore, the base portions of the heat radiation parts abut on each other.

9 Claims, 12 Drawing Sheets

(51) Int. Cl.
*H05K 1/02* (2006.01)
*F28F 3/02* (2006.01)
*H05K 1/18* (2006.01)

(56) References Cited

U.S. PATENT DOCUMENTS

| | | | | |
|---|---|---|---|---|
| 4,381,032 A | * | 4/1983 | Cutchaw | H01L 23/4338 |
| | | | | 165/185 |
| 4,770,242 A | * | 9/1988 | Daikoku | H01L 23/4338 |
| | | | | 165/185 |
| 4,800,956 A | * | 1/1989 | Hamburgen | H01L 23/4338 |
| | | | | 165/185 |
| 5,083,373 A | * | 1/1992 | Hamburgen | H01L 23/433 |
| | | | | 257/714 |
| 5,609,201 A | * | 3/1997 | Anderson | F28F 3/12 |
| | | | | 165/122 |
| RE35,721 E | * | 2/1998 | Daikoku | H01L 23/4338 |
| | | | | 165/185 |
| 5,964,285 A | * | 10/1999 | Huang | H01L 23/3672 |
| | | | | 165/185 |
| 6,223,815 B1 | * | 5/2001 | Shibasaki | F28F 13/00 |
| | | | | 165/185 |
| 6,223,970 B1 | * | 5/2001 | Chen | B23K 20/023 |
| | | | | 228/44.3 |
| 6,367,152 B1 | * | 4/2002 | Kataoka | B23P 15/26 |
| | | | | 165/185 |
| 6,374,490 B1 | * | 4/2002 | Miyahara | B21D 22/04 |
| | | | | 29/557 |
| 7,849,914 B2 | * | 12/2010 | Di Stefano | H01L 23/473 |
| | | | | 165/46 |
| 9,609,785 B1 | * | 3/2017 | Babcock | H05K 7/20154 |
| 9,625,220 B1 | * | 4/2017 | Ahbel | F28F 27/02 |
| 9,841,772 B2 | * | 12/2017 | Bucher | H01L 23/36 |
| 9,894,805 B2 | * | 2/2018 | Kim | F28D 21/00 |
| 10,172,265 B2 | * | 1/2019 | Wrona | H05K 7/2039 |
| 10,297,525 B2 | * | 5/2019 | Gong | H01L 23/473 |
| 2003/0221814 A1 | * | 12/2003 | Kamath | F28F 3/022 |
| | | | | 165/80.3 |
| 2006/0185896 A1 | * | 8/2006 | Ikeda | H01L 23/36 |
| | | | | 174/520 |
| 2006/0230616 A1 | * | 10/2006 | Zaghlol | H01L 21/4882 |
| | | | | 29/890.049 |
| 2007/0107880 A1 | * | 5/2007 | Hong | F04D 13/024 |
| | | | | 165/104.33 |
| 2007/0246193 A1 | * | 10/2007 | Bhatti | F28D 15/0233 |
| | | | | 165/104.21 |
| 2010/0243229 A1 | * | 9/2010 | Liu | B21D 53/085 |
| | | | | 165/185 |
| 2010/0258287 A1 | * | 10/2010 | Chen | H01L 21/4882 |
| | | | | 165/185 |
| 2011/0141742 A1 | * | 6/2011 | Tanaka | F21S 41/155 |
| | | | | 362/294 |
| 2014/0036451 A1 | * | 2/2014 | Simon | H01L 23/4093 |
| | | | | 361/720 |
| 2014/0355286 A1 | * | 12/2014 | Arita | B60Q 1/0041 |
| | | | | 362/516 |
| 2015/0327394 A1 | * | 11/2015 | Davis | H01L 23/4006 |
| | | | | 361/720 |

FOREIGN PATENT DOCUMENTS

| | | |
|---|---|---|
| JP | 2000-022364 A | 1/2000 |
| JP | 2006-237060 A | 9/2006 |
| JP | 2006-245181 A | 9/2006 |

* cited by examiner

COOLING STRUCTURE AND MOUNTING STRUCTURE

INCORPORATION BY REFERENCE

This application is based upon and claims the benefit of priority from Japanese patent application No. 2018-045080, filed on Mar. 13, 2018, the disclosure of which is incorporated herein in its entirety by reference.

TECHNICAL FIELD

The present invention relates to a cooling structure and a mounting structure.

BACKGROUND ART

There is a case where a cooling structure called a heat sink or the like is used to cool a heat generating component mounted on a board.

A technique relating to such a cooling structure is available in, for example, Patent Document 1. Patent Document 1 describes a heat sink which has a structure easily folding along a line dividing the bottom surface into a plurality of partial regions. To be specific, Patent Document 1 discloses a structure in which four heat sink pieces are connected by a connecting portion.

Further, a related technique is available in, for example, Patent Document 2. Patent Document 2 describes a heat radiation fin which has a plurality of heat radiation members and a pressing plate having a plurality of openings. According to Patent Document 2, the heat radiation member is composed of a contact plate part like a flat plate and a heat radiation protrusion projecting in the center of the contact plate part. Moreover, the heat radiation protrusion of the heat radiation member projects from the opening of the pressing plate. When attached, the heat radiation fin presses the contact plate part with the pressing plate.

Further, a related technique is available in, for example, Patent Document 3. Patent Document 3 describes a resin-sealed semiconductor device having a structure in which a plurality of high thermal conductivity members are mounted on a semiconductor element sealed with a resin.

Patent Document 1: Japanese Unexamined Patent Application Publication No. JP-A 2006-237060
Patent Document 2: Japanese Unexamined Patent Application Publication No. JP-A 1994-077364
Patent Document 3: Japanese Unexamined Patent Application Publication No. JP-A 1990-078255

In order for a cooling structure such as a heat sink to exhibit higher cooling performance, it is desirable that the cooling structure is in firm contact with a heat generating component. However, due to a difference of thermal expansion coefficients of used materials between a substrate and a heat generating component such as an electronic component mounted on the substrate, warpage may occur in the electronic component after the electronic component is solder-mounted on the substrate. Then, as a result of such warpage, it is difficult to bring the cooling structure into contact with the heat generating component, which may make it difficult to increase the cooling performance of the cooling structure.

Regarding such a problem, in the technique of Patent Document 1, the number of the heat sink pieces is four, and a direction in which the heat sink can fold is limited. Therefore, it is difficult to completely cope with the warpage of the heat generating component, and it may be difficult to increase the cooling performance.

Further, in the technique described in Patent Document 2, a plurality of heat radiation members are provided, but there is no connection between the heat radiation members. Therefore, heat conduction between the heat radiation members is impossible, and there is a possibility that the cooling performance decreases accordingly.

Further, in the technique described in Patent Document 3, a plurality of high thermal conductivity members are attached on a semiconductor element sealed with a resin. Therefore, even if the technique described in Patent Document 3 is used, warpage in an electronic component occurs due to the difference of thermal expansion coefficients, and the cooling performance of the cooling member cannot be increased.

Thus, there has been a problem that it is difficult to increase cooling performance in a cooling structure such as a heat sink.

SUMMARY OF THE INVENTION

Accordingly, an object of the present invention is to provide a cooling structure and a mounting structure which solve the problem that it is difficult to increase cooling performance in a cooling structure such as a heat sink.

In order to achieve the object, a cooling structure as an aspect of the present invention includes: a plurality of heat radiation parts configured to cool a heat generating component; and a holding member configured to hold the plurality of heat radiation parts. The heat radiation parts each include a base portion located on the side of the heat generating component and a fin portion extending from the base portion and radiating heat. The plurality of base portions abut on each other.

Further, a mounting structure as another aspect of the present invention includes: a substrate equipped with a heat generating component; and a cooling structure mounted on the heat generating component. The cooling structure includes a plurality of heat radiation parts configured to cool the heat generating component and a holding member configured to hold the plurality of heat radiation parts. The heat radiation parts each include a base portion located on a side of the heat generating component and a fin portion extending from the base portion and radiating heat. The plurality of base portions abut on each other.

According to the present invention with the above configurations, it is possible to provide a cooling structure and a mounting structure which solve the problem that it is difficult to increase cooling performance in a cooling structure such as a heat sink.

EXAMPLE EMBODIMENT

First Example Embodiment

Figure 1:
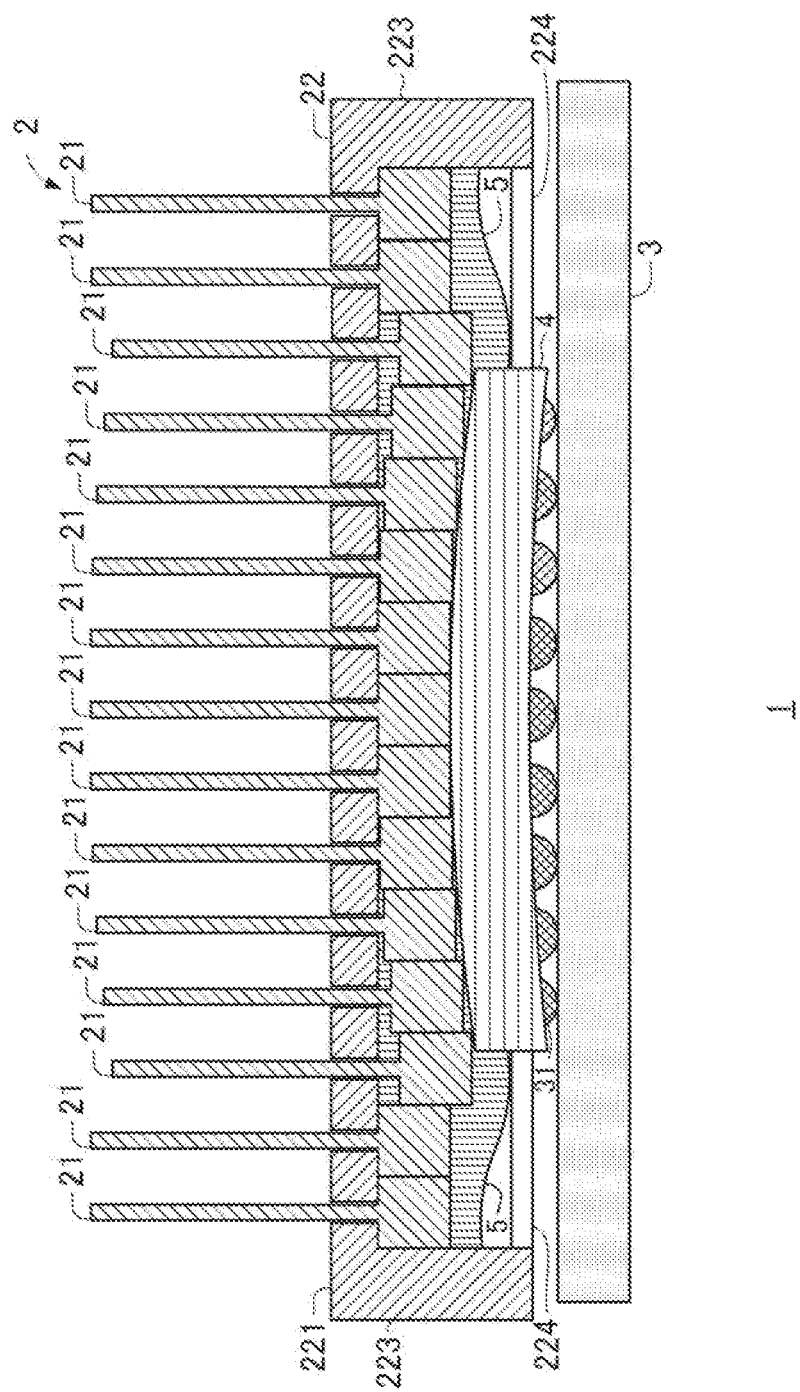
FIG. 1 is a cross section view showing an example of an overall configuration of a mounting structure according to a first example embodiment of the present invention.
Figure 2:
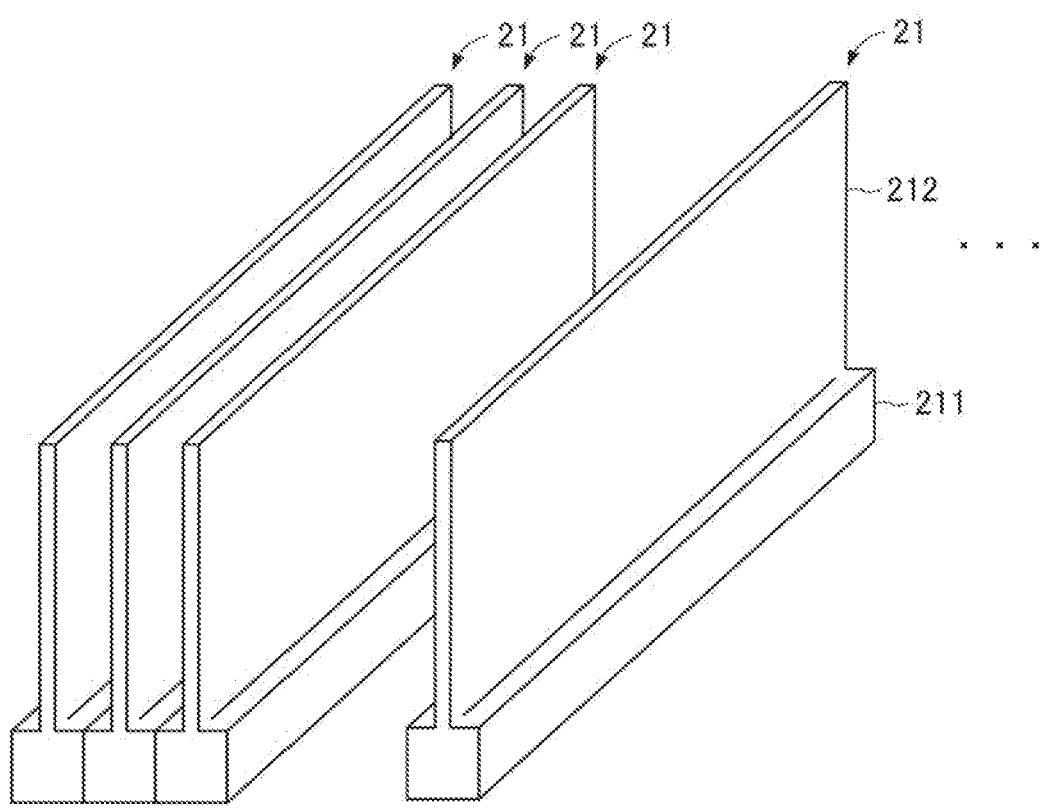
FIG. 2 is a perspective view showing an example of the configuration of a heat radiation part in the first example embodiment.
Figure 3:
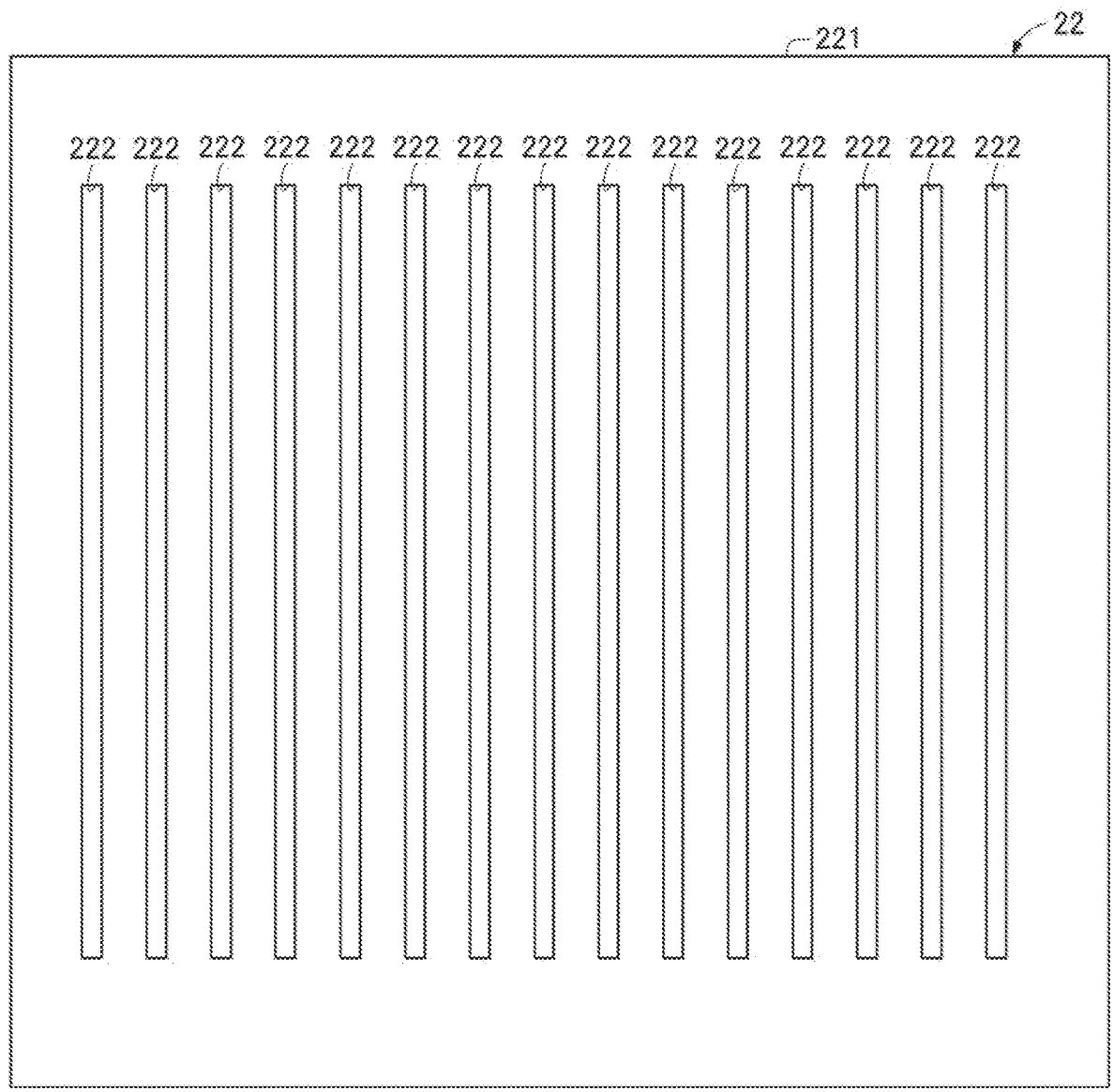
FIG. 3 is a plan view showing an example of the configuration of a holding member in the first example embodiment.
Figure 4:
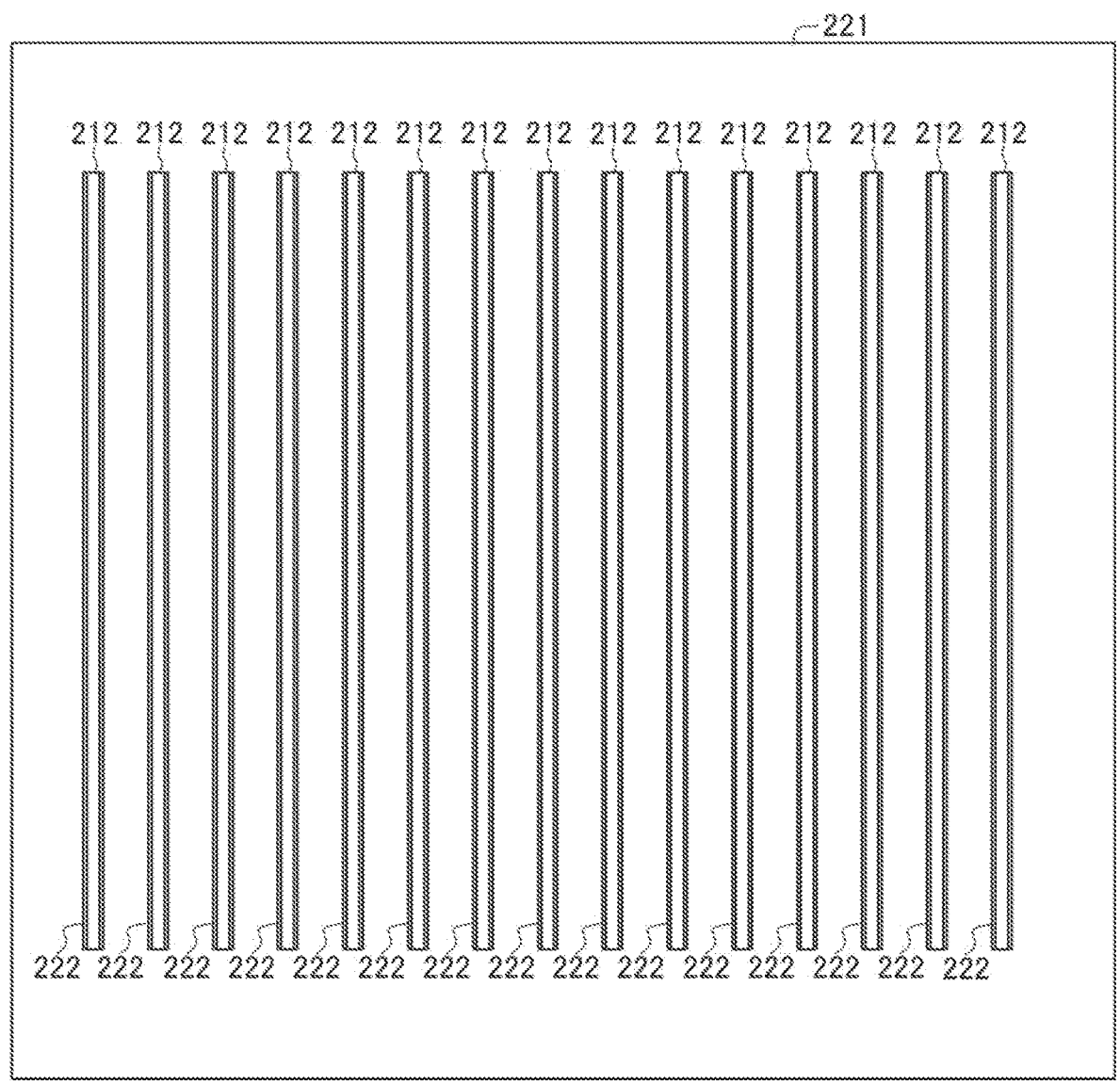
FIG. 4 is a plan view showing an example of a configuration that the heat radiation part is attached to the holding member.
Figure 5:
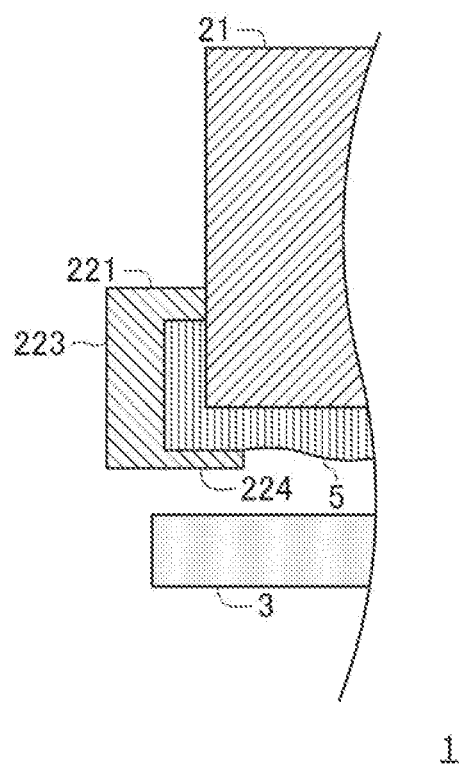
FIG. 5 is a cross section view for describing an example of a locking portion.

A first example embodiment of the present invention will be described with reference to FIGS. 1 to 5. FIG. 1 is a cross section view showing an example of an overall configuration of a mounting structure 1. FIG. 2 is a perspective view showing an example of the configuration of a heat radiation part 21. FIG. 3 is a plan view showing an example of the configuration of a holding member 22. FIG. 4 is a plan view showing an example of a configuration that the heat radiation part 21 is attached to the holding member 22. FIG. 5 is a cross section view for describing an example of a locking portion.

In the first example embodiment, the mounting structure 1 including a substrate 3 on which a heat generating component 4 such as an electronic component is mounted and a cooling structure 2 which assists in cooling the heat generating component 4 will be described. As will be described later, the cooling structure 2 in this example embodiment includes multiple rows of heat radiation parts 21. The heat radiation parts 21 each include a base portion 211 located on the side of the heat generating component 4 and a fin portion 212 extending from the base portion 211 to radiate heat, and are arranged so that the base portions 211 abut on each other. In other words, the multiple rows of heat radiation parts 21 are held by the holding member 22 in a state of being arranged so that the fin portions 212 do not abut on each other while the base portions 211 abut on each other.

FIG. 1 is a cross section view showing an example of the configuration of the mounting structure 1. With reference to FIG. 1, the mounting structure 1 has the substrate 3 on which the heat generating component 4 such as an electronic component is mounted and the cooling structure 2. In other words, on the substrate 3, the heat generating component 4 is mounted by using a solder ball 31 or the like. Moreover, on the heat generating component 4, the cooling structure 2 is mounted so as to contact the heat generating component 4

The cooling structure 2 includes the plurality of heat radiation parts 21 and the holding member 22 for holding the heat radiation parts 21. The heat radiation parts 21 and the holding member 22 included by the cooling structure 2 are made of, for example, a material which has excellent thermal conductivity (for example, copper, aluminum, or the like). Moreover, at least part of the inside of a space formed by the holding member 22 is filled with heat radiation grease 5.

The heat radiation part 21 contacts the heat generating component 4 to radiate heat generated by the heat generating component 4. FIG. 2 is a perspective view showing an example of the configuration of the heat radiation part 21. With reference to FIG. 2, the heat radiation part 21 has a configuration in which the base portion 211 located on the side of the heat generating component 4 and the fin portion 212 extending upward from the base portion 211 and radiating heat are connected.

The base portion 211 is a member located on the side of the heat generating component 4. The base portion 211 has, for example, a substantially prismatic shape. The base portion 211 contacts the heat generating component 4 via a contact surface, which is a lower surface of the base portion 211 (see FIG. 1). As shown in FIGS. 1 and 2, the width (the length in the horizontal direction in FIG. 1) of the base portion 211 is wider than the width of the fin portion 212. In other words, the base portion 211 is wider than the fin portion 212.

The fin portion 212 is a plate-like member having a substantially rectangular shape in plan view and front view. The fin portion 212 extends upward from an upper surface of the base portion 211 (that is, a surface opposite to the contact surface). The fin portion 212 assists in cooling the heat generating component 4 by releasing (radiating) heat generated from the heat generating component 4 to the outside.

FIG. 2 illustrates a case where the length in the longitudinal direction of the base portion 211 is equal to the length in the longitudinal direction of the fin portion 212. However, for example, the length in the longitudinal direction of the base portion 211 may be longer than the length in the longitudinal direction of the fin portion 212.

As shown in FIGS. 1 and 2, the cooling structure 2 has a configuration in which the multiple rows of heat radiation parts 21 having the above-described configuration are arranged. To be specific, the heat radiation parts 21 are arranged so that the fin portions 212 do not abut on each other while the base portions 211 abut on each other. Moreover, the heat radiation parts 21 are held by the holding member 22 in a state of being arranged in the above-described manner. In other words, the plural rows of heat radiation parts 21 are held by the holding member 22 in a state of being arranged so that the fin portions 212 do not abut on each other while the base portions 211 abut on each other.

The holding member 22 holds the multiple rows of heat radiation parts 21. As shown in FIGS. 1 and 3, the holding member 22 includes a plate-like portion 221 on which a plurality of through holes 222 are formed and an edge portion 223 formed on the periphery of the plate-like portion 221. As will be described later, the holding member 22 holds the heat radiation part 21 so that part of the heat radiation part 21 (at least the base portion 211) is in a space formed by the plate-like portion 221 and the edge portion 223.

The plate-like portion 221 is a plate-like member having a substantially rectangular shape in plan view. As shown in FIG. 3, on the plate-like portion 221, a plurality of through holes 222 piercing the plate-like portion 221 in the thickness direction are formed at approximately equal intervals. The size of the through hole 222 is a size appropriate for the shape of the fin portion 212. In other words, the through hole 222 is formed so that the fin portion 212 can be inserted therein. The holding member 22 holds the heat radiation part 21 in a state that the fin portions 212 are inserted in the through holes 222 (see FIG. 4).

The edge portion 223 is a portion that extends downward from the periphery of the plate-like portion 221. As described above, the holding member 22 holds the heat radiation part 21 so that part of the heat radiation part 21 is in the space formed by the edge portion 223 and the plate-like portion 221. Moreover, at the lower end of the edge portion 223, a locking portion 224 for preventing the heat radiation part 21 from falling is formed. As shown in FIG. 5, the locking portion 224 is formed inward from the lower end of the edge portion 223. With such a configuration, when the heat radiation part 21 held by the holding member 22 moves downward by a predetermined amount, the bottom end of the heat radiation part 21 contacts the locking portion 224. Thus, the heat radiation part 21 is prevented from falling. In other words, in order to prevent the heat radiation part 21 from falling, the length in the longitudinal direction of the heat radiation part 21 (the fin portion 212) in plan view is longer than the length of an opening formed on the lower side of the holding member 22.

Further, as described above, heat radiation grease 5 which is viscous and transforms in accordance with external force and so on is filled in the space formed by the plate-like portion 221 and the edge portion 223. For example, the heat radiation grease 5 transforms in accordance with movement of the heat radiation parts 21.

For example, the heat radiation grease 5 filled in the abovementioned space fills a gap (a space) between the heat radiation parts 21 and the heat generating component 4. Consequently, the heat radiation grease 5 secures thermal conductivity between the heat radiation part 21 and the heat generating component 4. Moreover, the heat radiation grease 5 filled in the space between the heat radiation parts 21 and the heat generating component 4 prevents the heat radiation part 21 from falling by surface extension of the heat radiation grease 5.

Further, the heat radiation grease 5 filled in the space fills a gap (a space) between the heat radiation parts 21 and the plate-like portion 221. Consequently, the heat radiation grease 5 secures thermal conductivity between the heat radiation parts 21 and the plate-like portion 221. Moreover, the heat radiation grease 5 filled in the space between the heat radiation part 21 and the plate-like portion 221 presses the base portion 211 of the heat radiation part 21 toward the heat generating component 4 when the cooling structure 2 is pressed downward (toward the heat generating component 4). Thus, the heat radiation grease 5 also functions as a pressing member which presses the base portion 211 toward the heat generating component 4 to fill the gap.

The holding member 22 has, for example, the configuration as described above and holds the heat radiation part 21 in the above-described manner. As a result, the heat radiation part 21 held by the holding member 22 can move in the vertical direction in the space formed by the plate-like portion 221 and the edge portion 223. Herein, the heat generating component 4 may be warped when mounted on the substrate 3 due to a difference in thermal expansion coefficient of material between the heat generating component 4 and the substrate 3 or the like. According to the cooling structure 2 described in this example embodiment, each of the heat radiation parts 21 can move (press) in accordance with the warpage of the heat generating component 4. That is, it is possible to move each of the heat radiation parts 21 so as to contact the heat generating component 4. Consequently, even if the heat generating component 4 is warped, it is possible to make the heat radiation parts 21 directly contact the heat generating component 4 as much as possible.

In other words, the holding member 22 in this example embodiment includes the plurality of heat radiation parts 21. Moreover, the holding member 22 holds the heat radiation part 21 so that the contact surface of the base portion 211 can move in accordance with the shape of the heat generating component 4. Such a configuration enables the heat radiation parts 21 to efficiently contact the heat generating component 4 even if the heat generating component 4 is warped. As a result, it is possible to efficiently assist in cooling the heat generating component 4.

It should be noted that the cooling structure 2 may be fixed to the substrate 3. The cooling structure 2 and the substrate 3 can be fixed by, for example, connecting the substrate 3 and the edge portion 223 by using a screw or a spring. The cooling structure 2 and the substrate 3 may be fixed by using a solder, an adhesive, or the like.

The substrate 3 is a plate-like substrate such as a glass epoxy substrate (may be a composition other than exemplified). The substrate 3 has, for example, a substantially rectangular shape in plan view. As described above, the heat generating component 4 is mounted on the substrate 3. Moreover, the cooling structure 2 can be fixed on the substrate 3.

The heat generating component 4 is mounted on the substrate 3, for example, by using the solder ball 31. The heat generating component 4 is an electronic component or the like, such as a CPU (Central Processing Unit), a GPU (Graphics Processing Unit), a FPGA (field-programmable gate array) and a memory chip. The heat generating component 4 may be a component which generates heat, other than exemplified above.

The above is an example of the configuration of the mounting structure 1.

As described above, the cooling structure 2 in this example embodiment has the multiple rows of heat radiation parts 21. The holding member 22 holds the heat radiation part 21 so that the contact surface of the base portion 211 can move in accordance with the shape of the heat generating component 4. Such a configuration enables the heat radiation parts 21 to efficiently contact the heat generating component 4 even if the heat generating component 4 is warped. As a result, it is possible to efficiently assist in cooling the heat radiating component 4. That is, it is possible to increase the cooling performance in the cooling structure 2.

Further, the cooling structure 2 in this example embodiment holds the heat radiation parts 21 in a state of being arranged so that the base portions 211 abut on each other. Such a configuration enables the heat radiation parts 21 to conduct heat with each other. As a result, it is possible to efficiently assist in cooling the heat generating component 4. That is, it is possible to increase cooling performance in the cooling structure 2.

Second Example Embodiment

Figure 6:
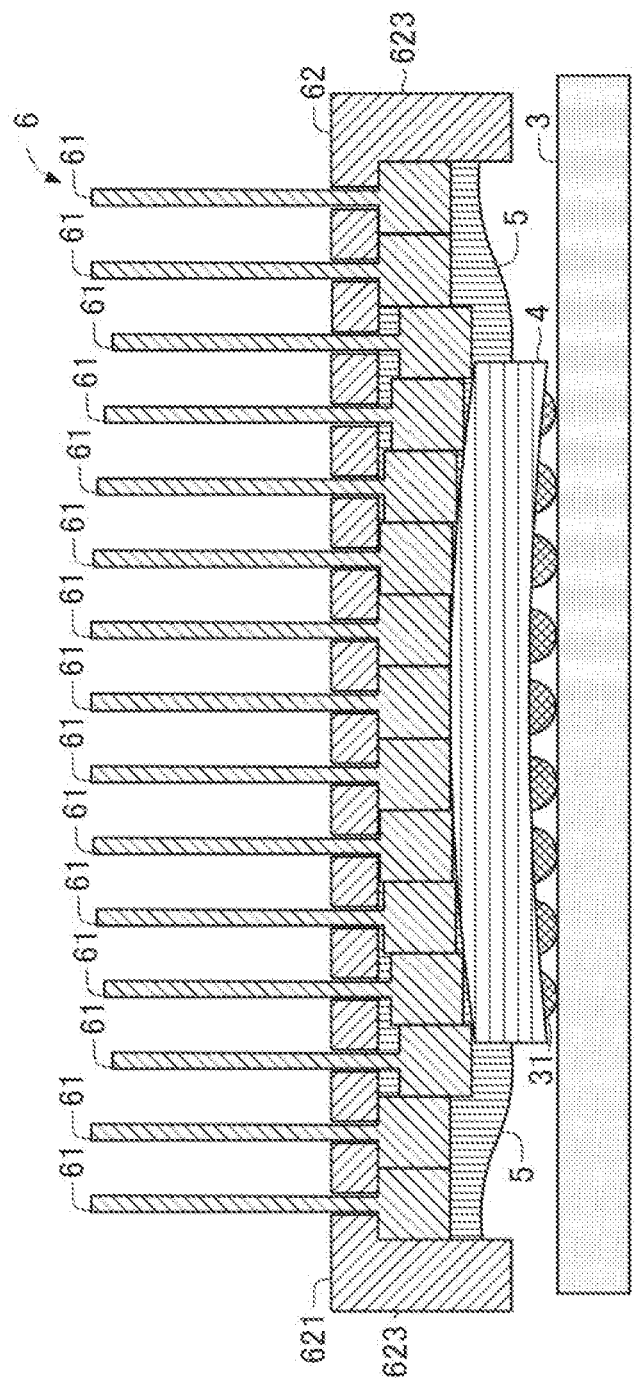
FIG. 6 is a cross section view showing an example of an overall configuration of a mounting structure according to a second example embodiment of the present invention.
Figure 7:
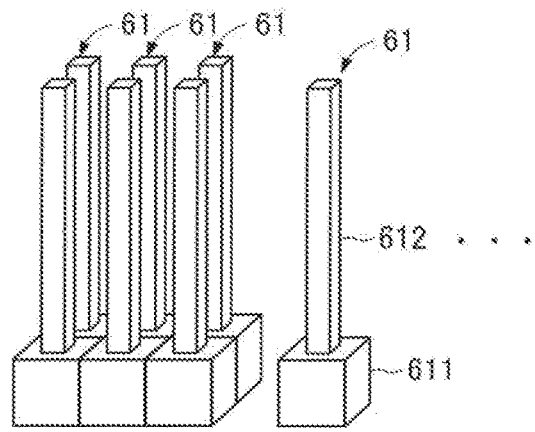
FIG. 7 is a perspective view showing an example of the configuration of a heat radiation part in the second example embodiment.
Figure 8:
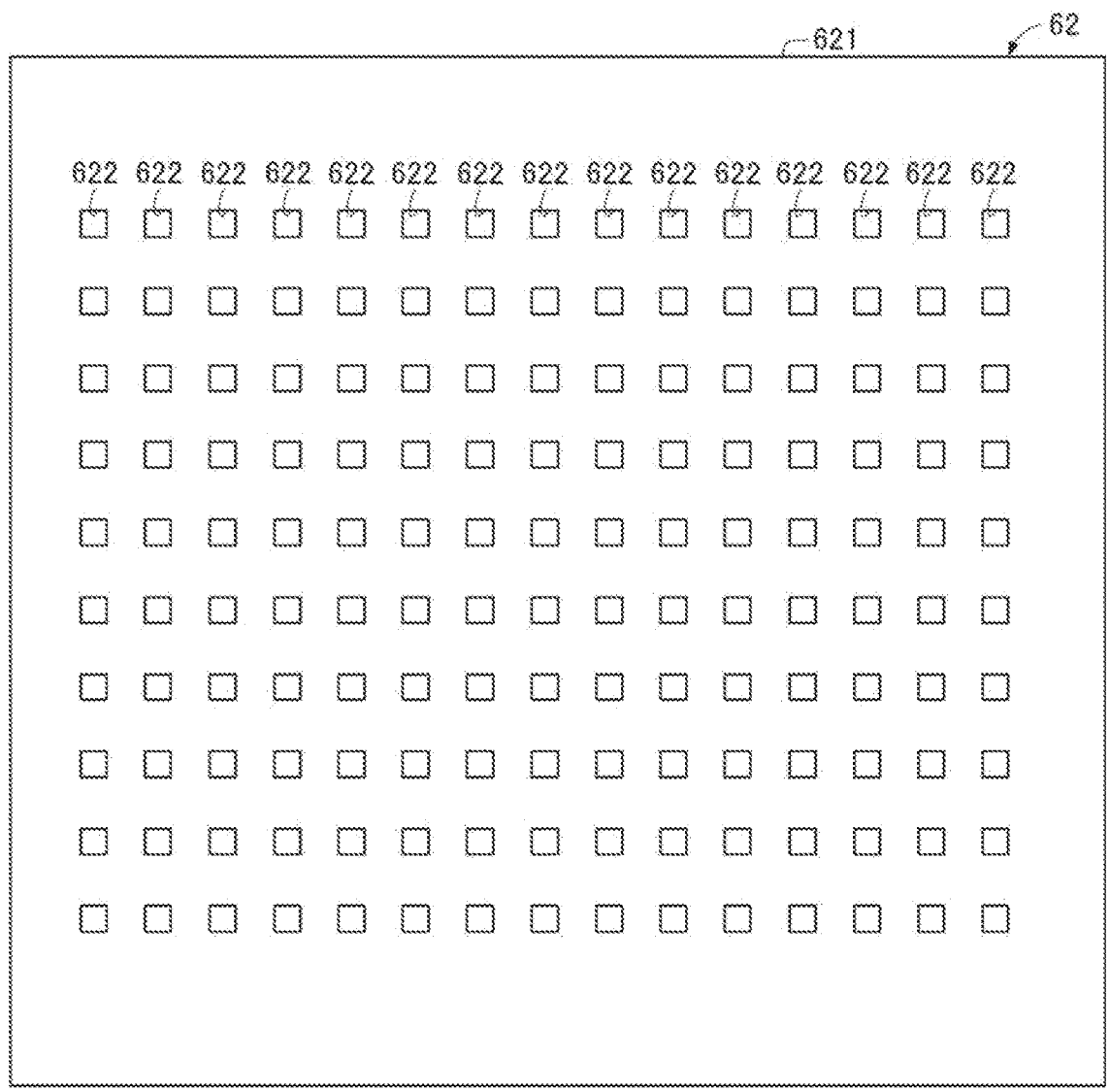
FIG. 8 is a plan view showing an example of the configuration of a holding member in the second example embodiment.
Figure 9:
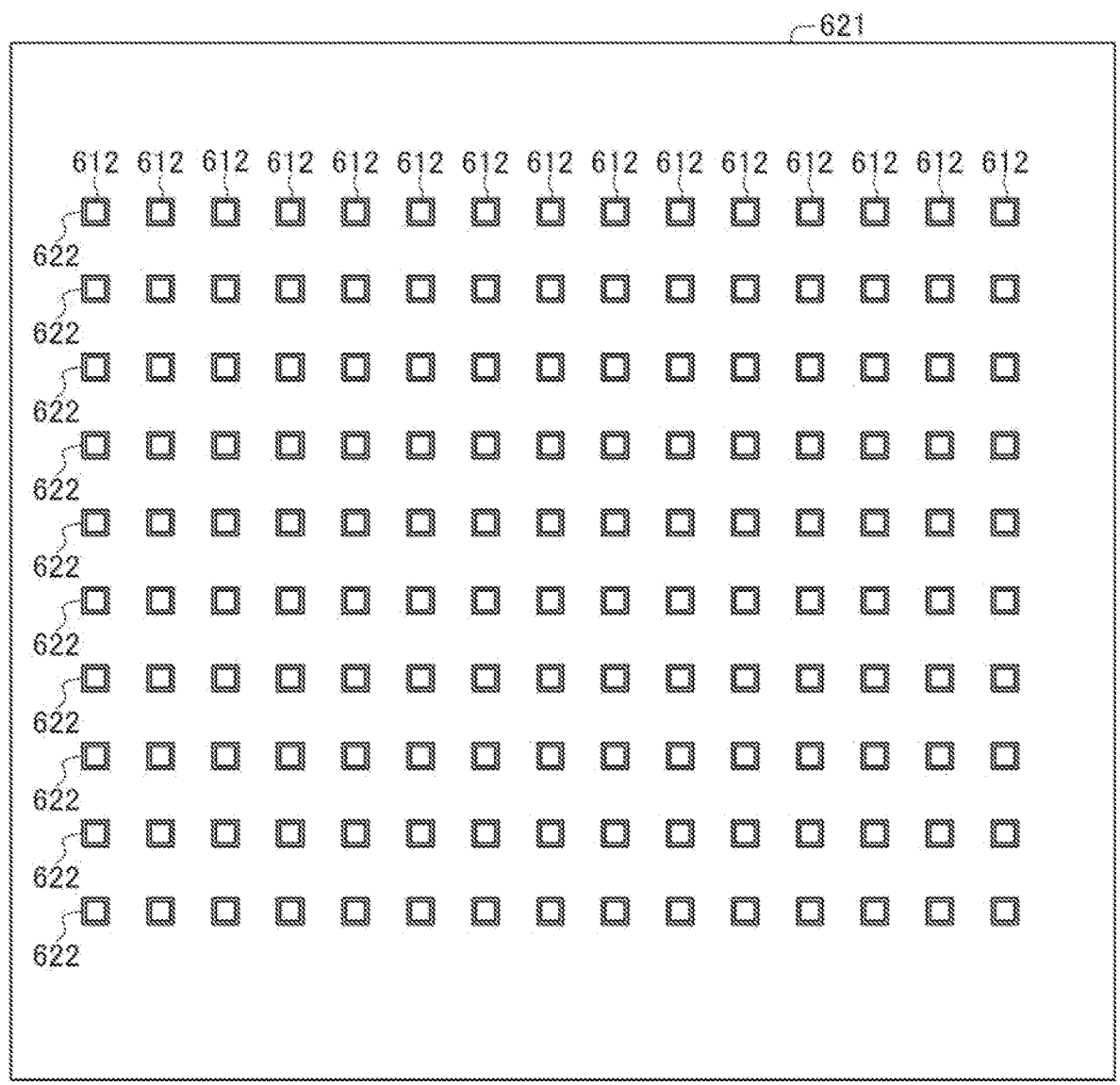
FIG. 9 is a plan view showing an example of a configuration that the heat radiation part is attached to the holding member.

Next, with reference to FIGS. 6 to 9, a second example embodiment of the present invention will be described. FIG. 6 is a cross section view showing an example of an overall configuration of a mounting structure 10. FIG. 7 is a perspective view showing an example of the configuration of a heat radiation part 61. FIG. 8 is a plan view showing an example of the configuration of a holding member 62. FIG. 9 is a plan view showing an example of a configuration that the heat radiation part 61 is attached to the holding member 62.

In the second example embodiment, the mounting structure 10 having a cooling structure 6, which is a modification example of the cooling structure 2 described in the first embodiment, will be described. As will be described later, the cooling structure 6 in this example embodiment includes a plurality of heat radiation parts 61 each having a fin portion 612 having a columnar shape (for example, a prismatic shape or a cylindrical shape). That is, in the cooling structure 6, the heat radiation part 61 is formed by further dividing the heat radiation part 21. The heat radiation part 61 includes a base portion 611 located on the side of the heat generating component 4 and a fin portion 612 extending from the base portion 611 to radiate heat. The heat radiation parts 61 are arranged so that the base portions 611 abut on each other. In other words, in the same manner as the heat radiation parts 21, the plurality of heat radiation parts 61 are held by the holding member 62 in a state of being arranged so that the fin portions 612 do not abut on each other while the base portions 611 abut on each other.

FIG. 6 is a cross section view showing an example of the configuration of the mounting structure 10. With reference to FIG. 6, the mounting structure 10 includes the cooling structure 6 instead of the cooling structure 2 when compared with the mounting structure 1 described in the first example embodiment. The substrate 3 and the heat generating component 4 are configured in the same manner as in the first example embodiment.

The cooling structure 6 includes the plurality of heat radiation parts 61 and the holding member 62 that holds the heat radiation parts 61. The heat radiation parts 61 and the holding member 62 included by the cooling structure 6 are made of, for example, a material which has excellent thermal conductivity (for example, copper, aluminum, or the like), as well as the heat radiation parts 21 and the holding member 22 described in the first example embodiment. Moreover, at least part of the inside of a space formed by the holding member 62 is filled with the heat radiation grease 5.

The heat radiation part 61 contacts the heat generating component 4 to radiate heat generated by the heat generating component 4. FIG. 7 is a perspective view showing an example of the configuration of the heat radiation part 61. With reference to FIG. 7, the heat radiation part 61 has a configuration in which the base portion 611 located on the side of the heat generating component 4 and the fin portion 612 extending upward from the base portion 611 and radiating heat are connected.

The base portion 611 is a member located on the side of the heat generating component 4. The base portion 611 has, for example, a substantially cuboid shape (for example, the shape of a cube). The base portion 611 contacts the heat generating component 4 via a contact surface, which is a lower surface located of the base portion 611 (see FIG. 6). As shown in FIGS. 6 and 7, the width (a length in the horizontal direction in FIG. 6) of the base portion 611 is wider than the width of the fin portion 612. In other words, the base portion 611 is wider than the fin portion 612.

The fin portion 612 is a columnar (that is, prismatic or cylindrical) member having a substantially rectangular shape (for example, a substantially square shape) or a circular shape in plan view and a substantially rectangular shape in front view. The fin portion 612 extends upward from an upper surface of the base portion 611 (that is, a surface opposite to the contact surface). The fin portion 612 assists in cooling the heat generating component 4 by releasing (radiating) heat generated by the heat generating component 4 to the outside.

As shown in FIGS. 6 and 7, the cooling structure 6 has a configuration in which the plurality of heat radiation parts 61 having the above-described configuration are arranged. To be specific, the heat radiation parts 61 are arranged so that the fin portions 612 do not abut on each other while the base portions 611 abut on each other. Moreover, the heat radiation parts 61 are held by the holding member 62 in a state of being arranged in the above-described manner. In other words, the plurality of heat radiation parts 61 are held by the holding member 62 in a state of being arranged so that the fin portions 612 do not abut on each other while the base portions 611 abut on each other.

The holding member 62 holds the plurality of heat radiation parts 61. The holding member 62 includes a plate-like portion 621 on which a plurality of through holes 622 are formed and an edge portion 623 formed at the periphery of the plate-like portion 621. In the same manner as the holding member 22, the holding member 62 holds the heat radiation part 61 so that part of the heat radiation part 61 (at least the base portion 611) is in a space formed by the plate-like portion 621 and the edge portion 623.

The plate-like portion 621 is a member formed like a plate and having a substantially rectangular shape in plan view. As shown in FIG. 8, on the plate-like portion 621, the plurality of through holes 622 that pierce the plate-like portion 621 in the thickness direction are formed at substantially equal intervals like a matrix, for example. The size of the through hole 622 is a size appropriate for the shape of the fin portion 612. In other words, the through hole 622 is formed so that the fin portion 612 can be inserted therein. For example, in a case where the fin portion 612 has a substantially rectangular shape in plan view, the through hole 622 has a substantially rectangular shape in plan view. Moreover, for example, in a case where the fin portion 612 has a substantially circular shape in plan view, the through hole 622 has a substantially circular shape in plan view. In the same manner as the holding member 22, the holding member 62 holds the heat radiation part 61 in a state that the fin portion 612 is inserted in the through hole 622 (see FIG. 9).

The edge portion 623 has the same configuration as the edge portion 223. On the edge portion 623, a configuration like the locking portion at the edge portion 223 may be formed or may not be formed. The configuration of the heat radiation grease 5 is the same as in the first example embodiment. The heat radiation part 61 in this example embodiment is prevented from falling by surface tension of the heat radiation grease 5.

The above is an example of the configuration of the cooling structure 6. Thus, the cooling structure 6 includes the heat radiation part 61 having the rod-like (prismatic) or cylindrical fin portion 612, and the respective heat radiation parts 61 are held so as to be movable in the vertical direction. The cooling structure 6 may be fixed to the substrate 3 in the same manner as the cooling structure 2.

As described above, the cooling structure 6 includes the plurality of heat radiation parts 61, formed by further dividing the heat radiation parts 21 of the cooling structure 2. Moreover, according to the cooling structure 6 in this example embodiment, the respective heat radiation parts 61 can move in the horizontal direction. With such a configuration, in the cooling structure 6, it is possible to make the heat radiation parts 61 contact the heat generating component 4 so as to more cope with the warpage of the heat generating component 4. As a result, the cooling structure 6 can efficiently assist in cooling the heat generating component 4. In other words, the cooling structure 6 includes the heat radiation parts 61 in a grid pattern and can cope with the warpage of the heat generating component 4 in biaxial directions. Consequently, even if the heat generating component 4 is warped, it is possible to more efficiently make the heat radiation parts 61 contact the heat generating component 4. As a result, it is possible to efficiently assist in cooling the heat generating component 4. That is, it is possible to increase cooling performance in the cooling structure 6.

Further, the cooling structure 6 in this example embodiment holds the heat radiation parts 61 in a state of being arranged so that the base portions 611 abut on each other. Such a configuration enables the heat radiation parts 61 to conduct heat with each other. As a result, it is possible to efficiently assist in cooling the heat generating component 4. That is, it is possible to increase cooling performance in the cooling structure 6.

Third Example Embodiment

Figure 10:
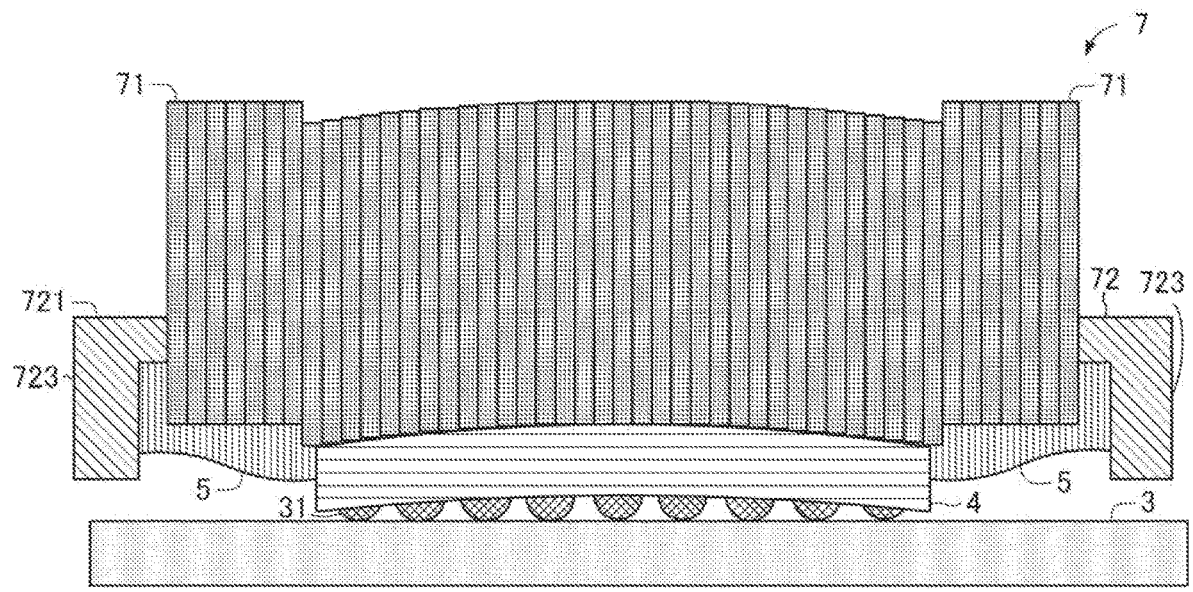
FIG. 10 is a cross section view showing an example of an overall configuration of a mounting structure according to a third example embodiment of the present invention.
Figure 11:
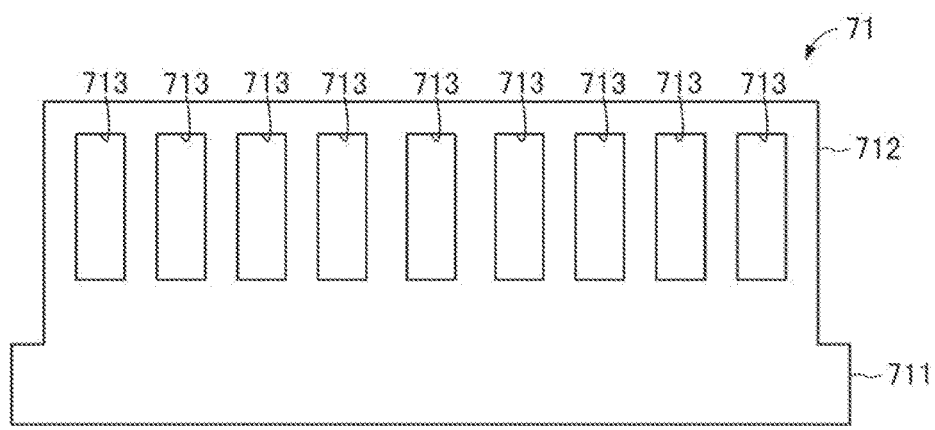
FIG. 11 is a front view showing an example of the configuration of a heat radiation part in the third example embodiment.
Figure 12:
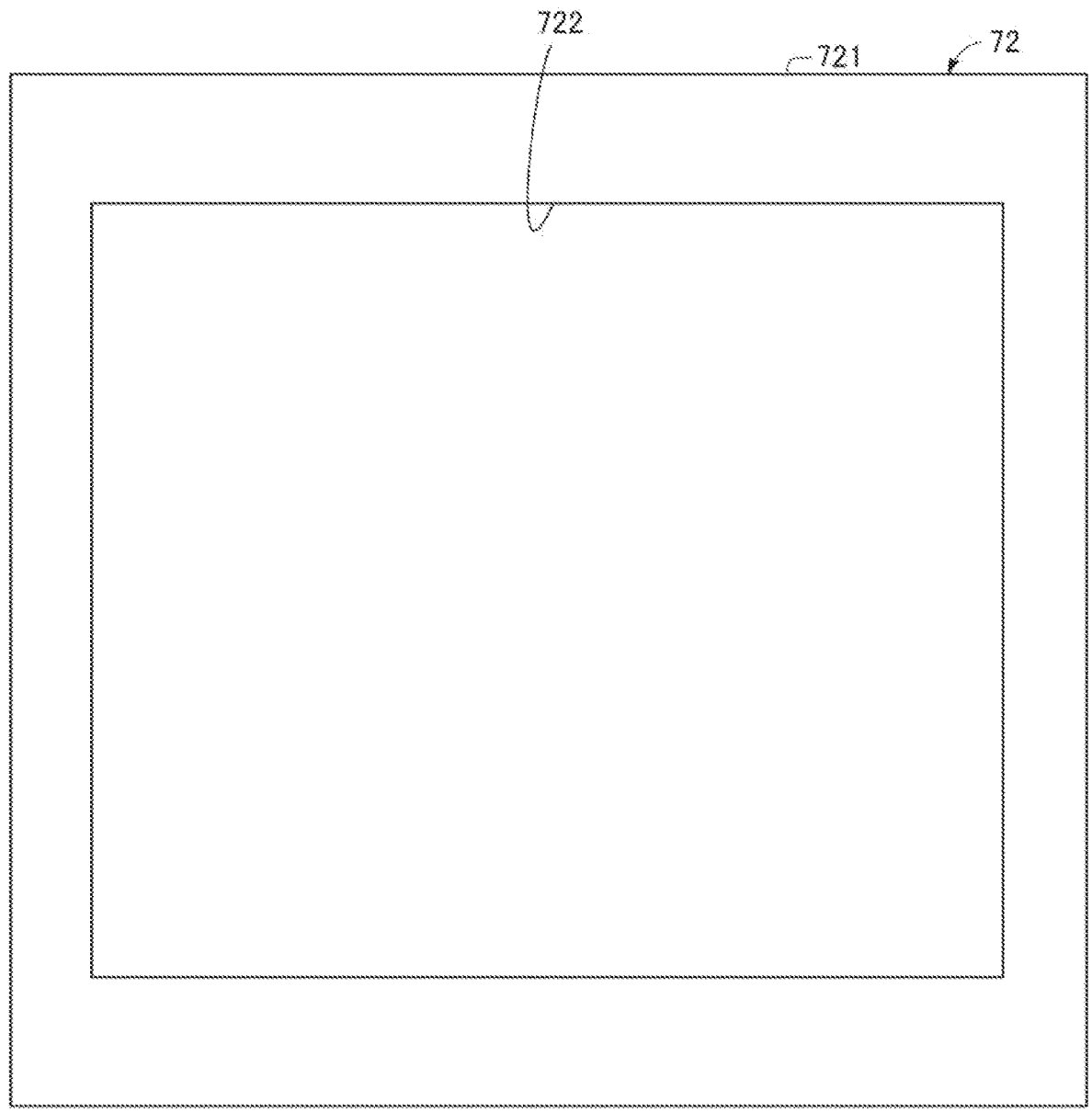
FIG. 12 is a front view showing an example of the configuration of a holding member in the third example embodiment.
Figure 13:
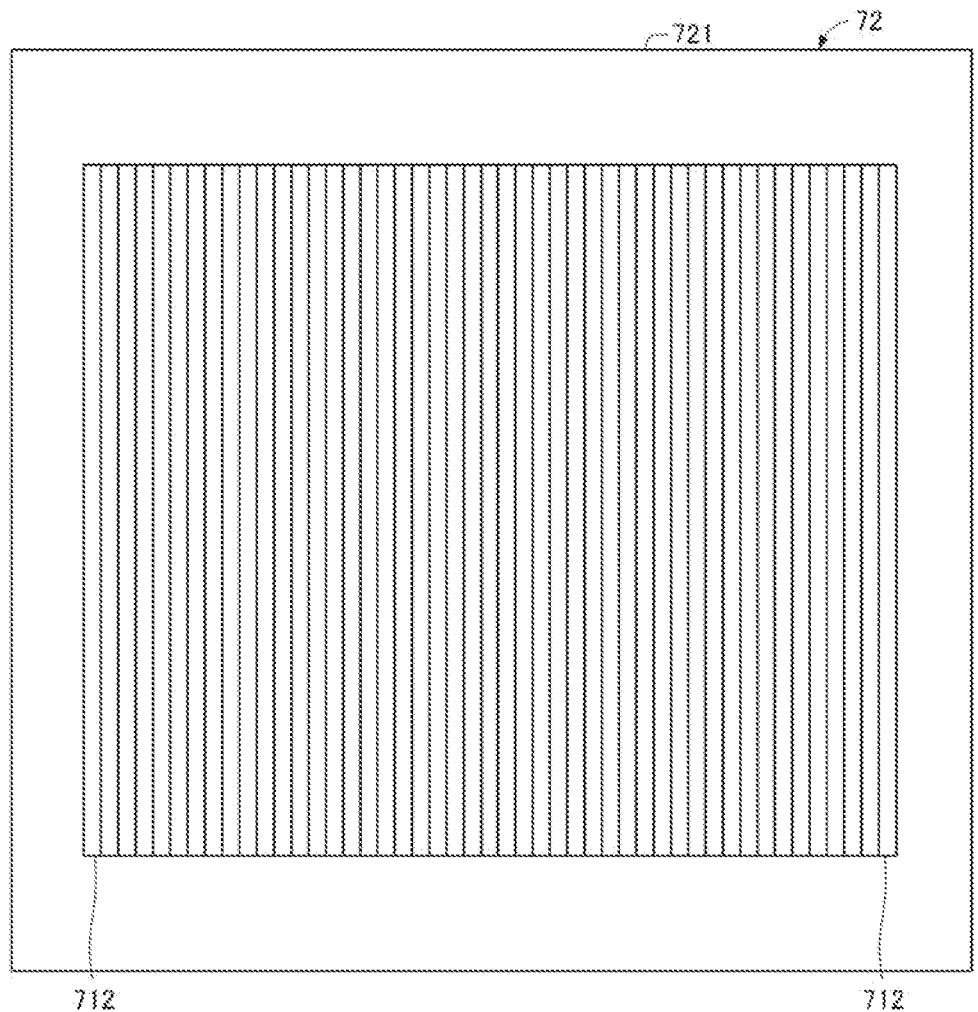
FIG. 13 is a plan view showing an example of a configuration that the heat radiation part is attached to the holding member.
Figure 14:
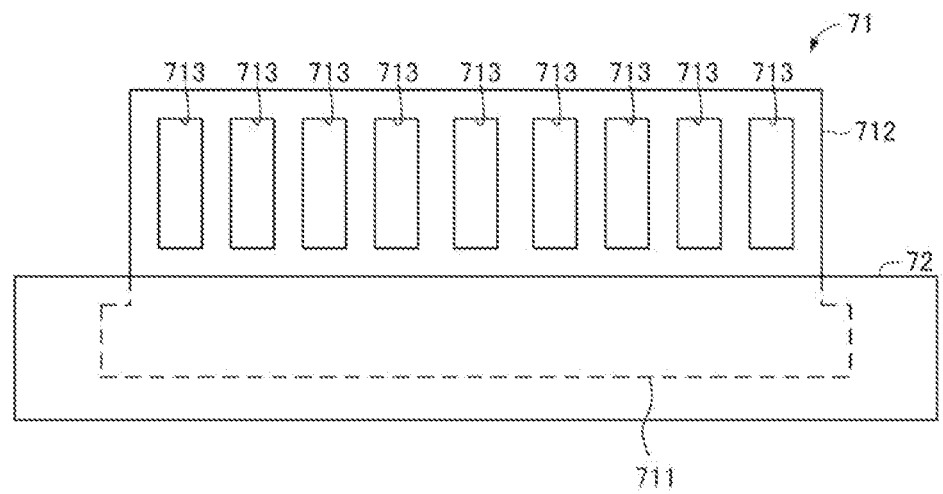
FIG. 14 is a front view showing an example of the configuration of the heat radiation part
Figure 15:
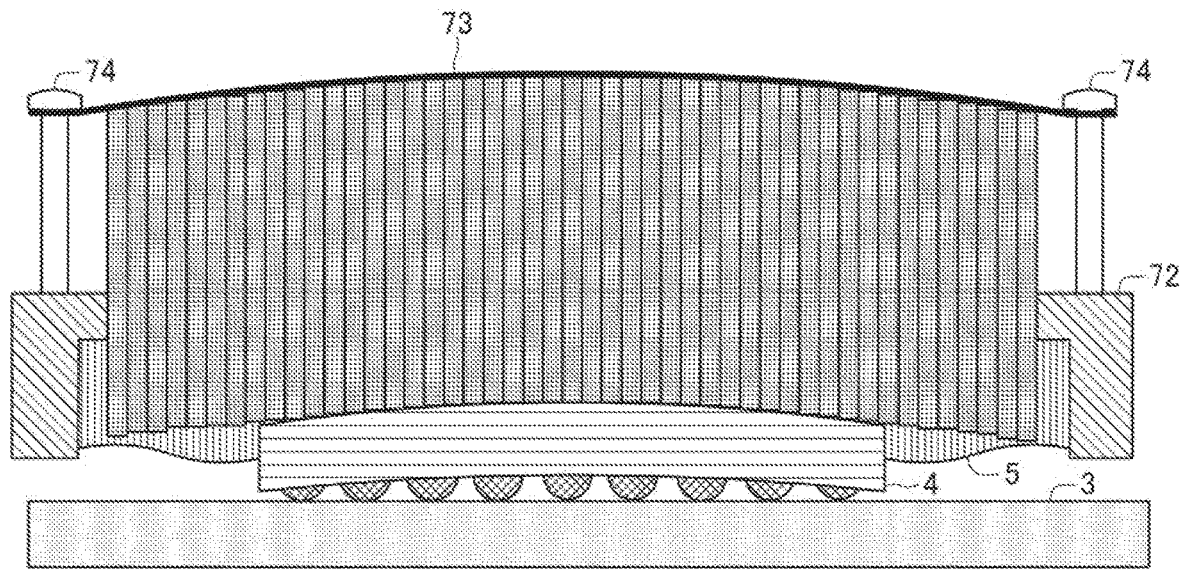
FIG. 15 is a cross section view showing an example of another configuration of the mounting structure.

Next, with reference to FIGS. 10 to 15, a third example embodiment of the present invention will be described. FIG. 10 is a cross section view showing an example of an overall configuration of a mounting structure 100. FIG. 11 is a front view showing an example of the configuration of a heat radiation part 71. FIG. 12 is a plan view showing an example of the configuration of a holding member 72. FIG. 13 is a plan view showing an example of a configuration in which the heat radiation part 71 is attached to the holding member 72. FIG. 14 is a front view showing an example of the configuration of the heat radiation part 71. FIG. 15 is a cross section view showing an example of another configuration included by the mounting structure 100.

In the third example embodiment, the mounting structure 100 including a cooling structure 7, which is a modification example of the cooling structure 2 described in the first example embodiment and the cooling structure 6 described in the second example embodiment, will be described. As will be described later, the cooling structure 7 in this example embodiment has a plurality of heat radiation parts 71 each including a base portion 711 and a fin portion 712 having comparable widths. In the cooling structure 7 described in this example embodiment, the heat radiation parts 71 are held by the holding member 72 in a state that the base portions 711 abut on each other and the fin portions 712 also abut on each other.

FIG. 10 is a cross section view showing an example of the configuration of the mounting structure 100. With reference to FIG. 10, when compared with the mounting structure 1 described in the first example embodiment and the mounting structure 10 described in the second example embodiment, the mounting structure 100 has the cooling structure 7 instead of the cooling structure 2 and the cooling structure 6. The substrate 3 and the heat generating component 4 are configured in the same manner as in the first example embodiment.

The cooling structure 7 includes the plurality of heat radiation parts 71 and the holding member 72 that holds the heat radiation parts 71. As well as the configurations described in the first and second example embodiments, the heat radiation parts 71 and the holding member 72 included by the cooling structure 7 are made of, for example, a material having excellent thermal conductivity (for example, copper, aluminum, or the like). Moreover, at least part of the inside of a space formed by the holding member 72 is filled with the heat radiation grease 5.

The heat radiation part 71 contacts the heat generating component 4 to radiate heat generated by the heat generating component 4. FIG. 11 is a front view showing an example of the configuration of the heat radiation part 71. With reference to FIG. 11, the heat radiation part 71 has a configuration in which the base portion 711 located on the side of the heat generating component 4 and the fin portion 712 extending upward from the base portion 711 and radiating heat.

The base portion 711 is a member located on the side of the heat generating component 4. The base portion 711 has, for example, a plate-like shape. The base portion 711 contacts the heat generating component 4 via a contact surface, which is a lower surface of the base portion 711 (see FIG. 10). As shown in FIG. 10, the width (the length in the horizontal direction in FIG. 10) of the base portion 711 is comparable with the width of the fin portion 712. In other words, the base portion 711 has a comparable width with the fin portion 712.

The fin portion 712 is a plate-like member having a substantially rectangular shape in plan view and in front view. The fin portion 712 extends upward from an upper surface (that is, a surface opposite to the contact surface) of the base portion 711. The fin portion 712 assists in cooling the heat generating component 4 by letting out (radiating) heat generated by the heat generating component 4 to the outside.

Further, on the fin portion 712, a plurality of through holes 713 which pierce the fin portion 712 in the thickness direction are formed. By forming the through holes 713 on the fin portion 712, it is possible to secure a wind tunnel when the fin portions 712 are made to abut on each other. Consequently, it is possible to secure cooling performance while making the fin portions 712 abut on each other.

As shown in FIG. 10, the cooling structure 7 has a configuration in which the multiple rows of heat radiation parts 71 configured in the above-described manner are arranged. To be specific, the heat radiation parts 71 are arranged in a state that the base portions 711 abut on each other and the fin portions 712 also abut on each other. Moreover, the heat radiation parts 71 are held by the holding member 72 in a state of being arranged in the above-described manner. In other words, the multiple rows of heat radiation parts 71 are held by the holding member 72 in a state that the base portions 711 abut on each other and the fin portions 712 also abut on each other.

The holding member 72 holds the plurality of heat radiation parts 71. The holding member 72 has a plate-like portion 721 on which a through hole 722 is formed and an edge portion 723 formed on the periphery of the plate-like portion 721. The holding member 72 holds the heat radiation part 71 so that part of the heat radiation part 71 (at least the base portion 711) is in a space formed by the plate-like portion 721 and the edge portion 723.

The plate-like portion 721 is a plate-like member having a substantially rectangular shape in plan view. As shown in FIG. 12, on the plate-like portion 721, the single through hole 722 that pierces the plate-like portion 721 in the thickness direction is formed. The size of the through hole 722 is a size appropriate for the shape of the fin portion 712. The through hole 722 has a size which enables the multiple rows of fin portions 712 held by the holding member 72 to be inserted in a state of abutting on each other. In the same manner as the holding member 22 and the holding member 62, the holding member 72 holds the heat radiation parts 71 in a state that the fin portions 712 are inserted into the through hole 722 (see FIG. 13).

The edge portion 723 has a configuration like the edge portion 223 and the edge portion 623. The edge portion 723 may be provided with a configuration like the locking portion at the edge portion 223, or may not be provided. Moreover, the configuration of the heat radiation grease 5 is the same as in the first example embodiment. The heat radiation part 71 in this example embodiment is prevented from falling by surface tension of the heat radiation grease 5.

The above is an example of the configuration of the cooling structure 7. Thus, the cooling structure 7 has the heat radiation part 71 having the plate-like fin portion 712, and holds the respective heat radiation parts 71 so as to be movable in the vertical direction.

As shown in FIG. 14, the length in the longitudinal direction of the base portion 711 in front view is longer than the length in the longitudinal direction of the fin portion 712 in front view. As shown in FIGS. 12 and 13, a corresponding length of the though hole 722 is comparable with the length of the fin portion 712. Therefore, the length in the longitudinal direction of the base portion 711 in front view is longer than the corresponding length of the through hole 722. With such a configuration, even if the heat radiation part 71 has the base portion 711 and the fin portion 712 having comparable widths, it is possible to prevent the heat radiation part 71 from moving upward from a predetermined position.

Further, the cooling structure 7 may be fixed to the substrate 3 in the same manner as the cooling structure 2 and the cooling structure 6.

As described above, the cooling structure 7 includes the heat radiation part 71 including the base portion 711 and the fin portion 712 having comparable widths. Moreover, on the fin portion 712, the plurality of through holes 713 are formed. Such a configuration enables the heat radiation part 71 to efficiently contact the heat generating component 4 even if the heat generating component 4 is warped. As a result, it is possible to efficiently assist in cooling the heat generating component 4. That is, it is possible to increase cooling performance in the cooling structure 7.

Further, the cooling structure 7 in this example embodiment holds the heat radiation parts 71 in a state of being arranged so that the base portions 711 abut on each other and the fin portions 712 also abut on each other. Moreover, the though holes 713 are formed on the fin part 712. Such a configuration enables the heat radiation parts 71 to conduct heat with each other, and it is possible to secure a wind tunnel for wind flowing between the fin portions 712. As a result, it is possible to efficiently assist in cooling the heat generating component 4. That is, it is possible to increase cooling performance in the cooling structure 7.

The cooling structure 7 may be provided with a plate spring 73, which is a pressing member that presses the base portion 711 of the heat radiation part 71 toward the heat generating component 4. The plate spring 73 is a transforming member which transforms in accordance with the heat radiation part 71 that is a target to be pressed, and presses the base portion 711 of the heat radiation part 71 toward the heat generating component 4. The plate spring 73 presses the heat radiation part 71 toward the heat generating component 4, thereby pressing the base portion 711 toward the heat generating component 4.

The plate spring 73 can be attached to the cooling structure 7 by using, for example, a screw 74 or the like. The plate spring 73 may be attached to the cooling structure 7 by a method other than the screw 74. Moreover, a structure for pressing the base portion 711 of the heat radiation part 71 of the cooling structure 7 toward the heat generating component 4 is not limited to the plate spring 73. For example, the cooling structure 7 may have a pressing plate having rubber, which is a transforming member, on the lower side, as the structure for pressing. In the cooling structure 7, a structure for pressing the base portion 711 of the heat radiation part 71 toward the heat generating component 4 may be realized by a structure other than illustrated above.

Further, the cooling structure 7 may have a member which presses the holding member 72 toward the heat generating component 4.

The cooling structure 2 described in the first example embodiment and the cooling structure 6 described in the second example embodiment may have a structure which is pressed toward the heat generating component 4 by the above-described plate spring 73 or the like.

Fourth Example Embodiment

Figure 16:
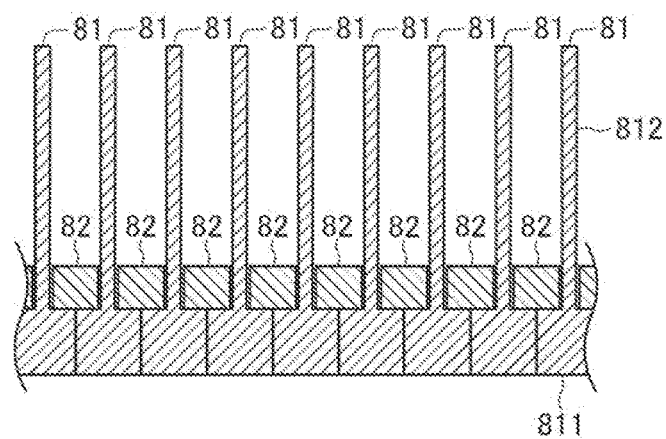
FIG. 16 is a cross section view showing an example of the configuration of a cooling structure according to a fourth example embodiment of the present invention.

Next, with reference to FIG. 16, a fourth example embodiment of the present invention will be described. FIG. 16 is a cross section view showing an example of the configuration of a cooling structure 8.

In the fourth example embodiment, the cooling structure 8 that cools a heat generating component will be described. In this example embodiment, the configuration of the cooling structure 8 will be described schematically.

FIG. 16 is a cross section view showing an example of the configuration of the cooling structure 8. With reference to FIG. 16, the cooling structure 8 has a plurality of heat radiation parts 81 and a holding member 82.

The heat radiation part 81 cools the heat generating component. Moreover, the holding member 82 holds the plurality of heat radiation parts 81.

The heat radiation part 81 includes a base portion 811 located on the side of the heat generating component, and a fin portion 812 extending from the base portion 811 to radiate heat. Moreover, as shown in FIG. 16, the base portions 811 abut on each other. In other words, the heat radiation parts 81 are held by the holding member 82 in a state that the base portions 811 abut on each other.

Thus, the cooling structure 8 has the plurality of heat radiation parts 81. With such a configuration, the respective heat radiation parts 81 are movable, so that it is possible to make the respective heat radiation parts 81 contact the heat generating component 4 even if the heat generating component is warped. As a result, it is possible to efficiently assist in cooling the heat generating component. That is, it is possible to increase cooling performance in the cooling structure 8.

Further, the cooling structure 8 in this example embodiment holds the heat radiation parts 81 in a state of being arranged so that the base portions 811 abut on each other. With such a configuration, it is possible to make the heat radiation parts 81 conduct heat via the adjacent base portions

811. As a result, it is possible to efficiently assist in cooling the heat generating component. That is, it is possible to increase cooling performance in the cooling structure 8.

It should be noted that the object of the present invention described above can also be realized by a mounting structure including the cooling structure 8. For example, the mounting structure has a substrate equipped with a hear generating component and the cooling structure 8 mounted on the heat generating component. The cooling structure 8 includes a plurality of heat radiation parts 81 cooling the heat generating component and a holding member holding the plurality of heat radiation parts 81. The heat radiation parts 81 each include the base portion 811 located on the side of the heat generating component and the fin portion 812 extending from the base portion and radiating heat. The plurality of base portions 811 abut on each other.

The invention relating to the mounting structure having the above-described configuration also has the same action as the cooling structure 8 and therefore can achieve the abovementioned object of the present invention.

<Supplementary Notes>

The whole or part of the example embodiments disclosed above can be described as the following supplementary notes. Below, a cooling structure and so on according to the present invention will be schematically described. However, the present invention is not limited to the following configurations.

(Supplementary Note 1)

A cooling structure comprising:

a plurality of heat radiation parts configured to cool a heat generating component; and a holding member configured to hold the plurality of heat radiation parts, wherein:

the heat radiation parts each include a base portion located on a side of the heat generating component and a fin portion extending from the base portion and radiating heat; and the plurality of base portions abut on each other.

(Supplementary Note 2)

The cooling structure according to Supplementary Note 1, wherein the holding member is configured to hold the heat radiation part so that a contact face of the base portion with the heat generating component can move in accordance with a shape of the heat generating component.

(Supplementary Note 3)

The cooling structure according to Supplementary Note 1 or 2, further comprising a pressing member configured to press the base portion toward the heat generating component.

(Supplementary Note 4)

The cooling structure according to Supplementary Note 3, wherein the pressing member includes a transforming member configured to transform in accordance with shapes of the plurality of heat radiation parts to be pressed and presses the base portions with the transforming member toward the heat generating component.

(Supplementary Note 5)

The cooling structure according to Supplementary Note 4, wherein the transforming member is configured to press the fin portion toward the heat generating component and thereby press the base portion toward the heat generating component.

(Supplementary Note 6)

The cooling structure according to Supplementary Note 4, wherein the transforming member is heat radiation grease filled inside the holding member.

(Supplementary Note 7)

The cooling structure according to any of Supplementary Notes 1 to 6, wherein the heat radiation part includes the fin portion formed like a plate having a substantially rectangular shape in plan view and the base portion having a broader width than the fin portion.

(Supplementary Note 8)

The cooling structure according to any of Supplementary Notes 1 to 6, wherein the heat radiation part includes the fin portion formed like a column having a rectangular shape or a circular shape in plan view and the base portion having a broader width than the fin portion.

(Supplementary Note 9)

The cooling structure according to any of Supplementary Notes 1 to 6, wherein the heat radiation part includes the fin portion formed like a plate having a substantially rectangular shape in plan view and the base portion having a comparable width with the fin portion.

(Supplementary Note 10)

The cooling structure according to Supplementary Note 9, wherein the plurality of fin portions abut on each other.

(Supplementary Note 11)

11. The cooling structure according to any of Supplementary Notes 1 to 10, wherein a through hole is formed in a thickness direction of the fin portion.

(Supplementary Note 12)

A mounting structure comprising:

a substrate equipped with a heat generating component; and a cooling structure mounted on the heat generating component, wherein:

the cooling structure includes a plurality of heat radiation parts configured to cool the heat generating component and a holding member configured to hold the plurality of heat radiation parts;

the heat radiation parts each include a base portion located on a side of the heat generating component and a fin portion extending from the base portion and radiating heat; and the plurality of base portions abut on each other.

Although the present invention has been described above with reference to the example embodiments, the present invention is not limited to the example embodiments described above. The configurations and details of the present invention can be changed in various manners that can be understood by one skilled in the art within the scope of the present invention.

DESCRIPTION OF REFERENCE NUMERALS

1 mounting structure
2 cooling structure
21 heat radiation part
211 base portion
212 fin portion
22 holding member
221 plate-like portion
222 through hole
223 edge portion
224 locking portion
3 substrate
31 solder ball
4 heat generating component
5 heat radiation grease
6 cooling structure
61 heat radiation part
611 base portion
612 fin portion
62 holding member 621 plate-like portion
622 through hole
623 edge portion
7 cooling structure
71 heat radiation part
711 base portion
712 fin portion
713 through hole
72 holding member
721 plate-like portion
722 through hole
723 edge portion
73 plate spring
74 screw
8 cooling structure
81 heat radiation part
811 base portion
812 fin portion
82 holding member

The invention claimed is:

1. A cooling structure comprising:
a plurality of heat radiation parts configured to cool a heat generating component;
a holding member configured to hold the plurality of heat radiation parts, wherein:
the heat radiation parts each include a base portion located on a side of the heat generating component and a fin portion extending from the base portion and radiating heat; and
the plurality of base portions abut on each other; and
a pressing member configured to press the base portion toward the heat generating component, wherein the pressing member includes a transforming member configured to transform in accordance with shapes of the plurality of heat radiation parts to be pressed and presses the base portions with the transforming member toward the heat generating component.

2. The cooling structure according to claim 1, wherein the holding member is configured to hold the heat radiation part so that a contact face of the base portion with the heat generating component can move in accordance with a shape of the heat generating component.

3. The cooling structure according to claim 1, wherein the transforming member is configured to press the fin portion toward the heat generating component and thereby press the base portion toward the heat generating component.

4. The cooling structure according to claim 1, wherein the transforming member is heat radiation grease filled inside the holding member.

5. The cooling structure according to claim 1, wherein the heat radiation part includes the fin portion formed like a plate having a substantially rectangular shape in plan view and the base portion having a broader width than the fin portion.

6. The cooling structure according to claim 1, wherein the heat radiation part includes the fin portion formed like a column having a rectangular shape or a circular shape in plan view and the base portion having a broader width than the fin portion.

7. The cooling structure according to claim 1, wherein the heat radiation part includes the fin portion formed like a plate having a substantially rectangular shape in plan view and the base portion having a comparable width with the fin portion.

8. The cooling structure according to claim 7, wherein the heat radiation part has a configuration in which the base portion and the fin portion are connected to each other.

9. The cooling structure according to claim 1, wherein a through hole is formed in a thickness direction of the fin portion.

* * * * *